US007834432B2

(12) United States Patent
Tu et al.

(10) Patent No.: US 7,834,432 B2
(45) Date of Patent: Nov. 16, 2010

(54) CHIP PACKAGE HAVING ASYMMETRIC MOLDING

(75) Inventors: Wu-Chang Tu, Tainan County (TW); Geng-Shin Shen, Tainan County (TW)

(73) Assignees: ChipMOS Technologies Inc., Hsinchu (TW); ChipMOS Technologies (Bermuda) Ltd, Hamilton (BM)

( * ) Notice: Subject to any disclaimer, the term of this patent is extended or adjusted under 35 U.S.C. 154(b) by 11 days.

(21) Appl. No.: 12/480,105

(22) Filed: Jun. 8, 2009

(65) Prior Publication Data

US 2009/0243056 A1 Oct. 1, 2009

Related U.S. Application Data

(63) Continuation of application No. 11/352,001, filed on Feb. 10, 2006, now Pat. No. 7,576,416.

(30) Foreign Application Priority Data

Aug. 2, 2005 (TW) .............................. 94126167 A (51) Int. Cl.
*H01L 23/495* (2006.01)

(52) U.S. Cl. .............................. 257/667; 257/E23.047; 257/666; 257/669; 438/112

(58) Field of Classification Search .......... 257/E23.039, 257/E23.043, E23.047, E23.124, 666, 667, 257/669, 676, 788, 691, 692, 696, 670, 718, 257/787, 673, 674; 438/112, 123, 124, 127
See application file for complete search history.

(56) References Cited

U.S. PATENT DOCUMENTS 4,177,480 A * 12/1979 Hintzmann et al. ......... 257/665
5,910,681 A * 6/1999 Kozono ...................... 257/666

5,998,866 A * 12/1999 Ochi et al. .................. 257/727
6,122,822 A * 9/2000 Liao ........................... 29/827

(Continued)

FOREIGN PATENT DOCUMENTS

CN 1116770 A 2/1996

(Continued)

OTHER PUBLICATIONS

Chinese First Examination Report of China Application No. 2005100898241, dated on Feb. 15, 2008.

*Primary Examiner*—Chris Chu
(74) *Attorney, Agent, or Firm*—J.C. Patents (57) ABSTRACT

A chip package having asymmetric molding includes a lead frame, a chip, an adhesive layer, bonding wires and a molding compound. The lead frame includes a turbulent plate and a frame body having inner lead portions and outer lead portions. The turbulent plate is bended downwards to form a concave portion. The first end of the turbulent plate is connected to the frame body, and the second end is lower than the inner lead portions. The chip is fixed under the inner lead portions through the adhesive layer. The bonding wires are connected between the chip and the inner lead portions. The molding compound encapsulates the chip, the bonding wires, and the turbulent plate. The ratio between the thickness of the molding compound over and under the concave portion is larger than 1. The thickness of the molding compound under and over the outer lead portions is not equal.

15 Claims, 7 Drawing Sheets

U.S. PATENT DOCUMENTS

| | | | |
|---|---|---|---|
| 6,329,705 B1 * | 12/2001 | Ahmad | 257/666 |
| 6,392,295 B1 * | 5/2002 | Iwaya et al. | 257/696 |
| 6,414,379 B1 * | 7/2002 | Chang et al. | 257/666 |
| 7,517,733 B2 * | 4/2009 | Camacho et al. | 438/123 |
| 7,714,419 B2 * | 5/2010 | Camacho et al. | 257/670 |
| 2002/0109215 A1 | 8/2002 | Iwaya et al. | 257/676 |

FOREIGN PATENT DOCUMENTS

| | | |
|---|---|---|
| JP | 09116074 | 5/1997 |
| JP | 09139455 | 5/1997 |
| JP | 11054685 | 2/1999 |
| JP | 11163243 | 6/1999 |
| TW | 396557 | 7/2000 |
| TW | 468258 | 12/2001 |

* cited by examiner

CHIP PACKAGE HAVING ASYMMETRIC MOLDING

CROSS-REFERENCE TO RELATED APPLICATION

This application is continuation application of U.S. application Ser. No. 11/352,001, filed on Feb. 10, 2006, which claims the priority benefit of Taiwan application serial No. 94126167, filed on Aug. 2, 2005. The entirety of each of the above-mentioned patent applications is hereby incorporated by reference herein and made a part of this specification.

BACKGROUND OF THE INVENTION

1. Field of Invention

The present invention relates to a chip package having asymmetric molding, and particularly to a chip package having a lead frame.

2. Description of the Related Art

To a dynamic random access memory (DRAM), the packages can be categorized into small outline J-lead packages (SOJ packages) and thin small outline packages (TSOP), both of which have fast transmission rate, good heat dissipation and compact size. In terms of lead frames, no matter SOJ packages or TSOP can be further classified into lead on chip packages (LOC packages) disclosed by U.S. Pat. No. 4,862,245 and chip on lead packages disclosed by U.S. Pat. No. 4,989,068.

Figure 1A:
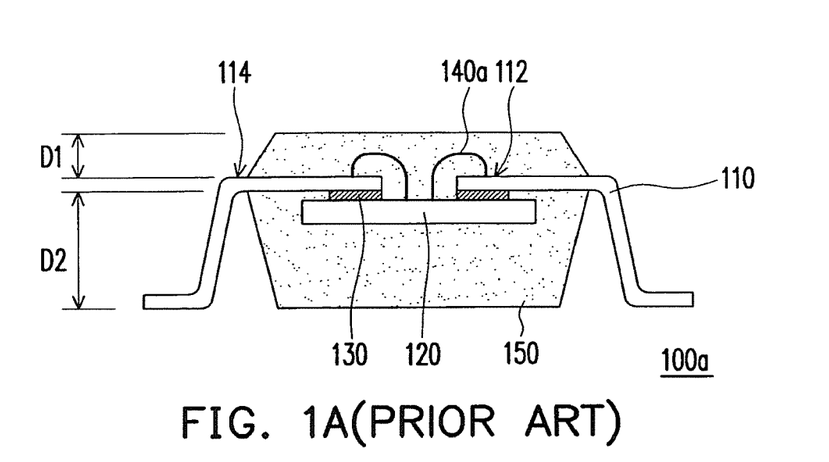
FIG. 1A is a schematic section view of a conventional thin small outline package (TSOP) having lead on chip (LOC) configuration.

FIG. 1A is a schematic section view of a conventional TSOP having LOC configuration. Referring to FIG. 1A, a conventional TSOP 100a includes a lead frame 110, a chip 120, an adhesive layer 130, a plurality of first bonding wires 140a and a molding compound 150. Wherein, the lead frame 110 has inner lead portions 112 and outer lead portions 114. The chip 120 is fixed on the lower surfaces of the inner lead portions 112 through the adhesive layer 130 disposed between the chip 120 and the inner lead portions 112. The first bonding wires 140a are electrically connected between the chip 120 and the corresponding inner lead portions 112, respectively. The molding compound 150 is used for encapsulating the inner lead portions 112, the chip 120, the adhesive layer 130 and the first bonding wires 140a.

It is noted that the thickness D1 of the molding compound 150 residing over the outer lead portions 114 is in the proportion of 1:3 to the thickness D2 of the molding compound 150 residing under the outer lead portions 114. Therefore, as the molding compound 150 condenses and shrinks, the TSOP 100a will be warped and damaged.

Figure 1B:
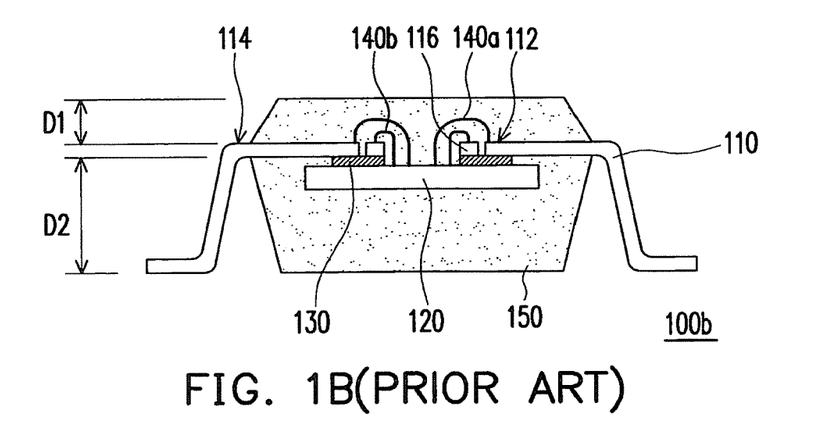
FIG. 1B is a schematic section view of another conventional thin small outline package (TSOP) having lead on chip (LOC) configuration.

FIG. 1B is a schematic section view of another conventional TSOP having LOC configuration. Continue referring to FIG. 1B, it is similar to FIG. 1A. The unique point with FIG. 1B is the conventional TSOP 100b herein further includes second bonding wires 140b, and the lead frame 110 further includes bus bars 116, which are adjacent to the inner lead portions 112. In addition, the second bonding wires 140b are electrically connected between the bus bars 116 and the chip 120. However, the conventional TSOP 100b has the same problem as described.

SUMMARY OF THE INVENTION

Based on the above-described background, an object of the present invention is to provide a chip package having asymmetric molding with better reliability.

Another object of the present invention is to provide a chip package having asymmetric molding, which has less warpage.

Based on the above-described objects or others, the present invention provides a chip package having asymmetric molding, which includes a lead frame, a chip, an adhesive layer, first bonding wires and an molding compound. Wherein, the lead frame includes a frame body and at least a turbulent plate. The frame body has inner lead portions and outer lead portions. The turbulent plate bends downwards to form a concave portion and has a first end and a second end. The first end connects to the frame body, and the second end is below the inner lead portions. The chip is fixed on the lower surfaces of the inner lead portions and the turbulent plate locates at one end of the chip. The adhesive layer is disposed between the chip and the inner lead portions. The first bonding wires are electrically connected between the chip and the corresponding inner lead portions, respectively. The molding compound is used for encapsulating at least the chip, the first bonding wires, the inner lead portions, the adhesive layer and the turbulent plate. Wherein, the ratio between the thickness of the part of the molding compound residing over the concave portion and the thickness of the part of the molding compound residing under the concave portion is larger than 1 and the thickness of the part of the molding compound residing under the outer lead portions and the thickness of the part of the molding compound residing over the outer lead portions are not equal to each other. From the top view, the chip area takes a less than 25% ratio of the entire molding compound area.

According to the embodiment of the present invention, the second end of the turbulent plate can be bended to be flat.

According to the embodiment of the present invention, the turbulent plate is bended downwards to form a concave portion first, followed by being bended upwards and the second end thereof is lower than the inner lead portions.

According to the embodiment of the present invention, the lead frame further includes at least a supporting bar, which is connected between the second end of the turbulent plate and the frame body. As an alternation, the supporting bar can be connected between the frame body and the turbulent plate, too.

According to the embodiment of the present invention, the inner lead portions can be designed in down-set.

According to the embodiment of the present invention, the turbulent plate can have openings.

According to the embodiment of the present invention, the lead frame can further include bus bars, which are adjacent to the inner lead portions. In addition, the chip package having asymmetric molding further includes second bonding wires electrically connected between the chip and the corresponding bus bars, respectively. The molding compound further encapsulates the second bonding wires and the bus bars.

Based on the above-described objects or others, the present invention provides a chip package having asymmetric molding, which includes a lead frame, a chip, an adhesive layer, first bonding wires and an molding compound. The lead frame includes a frame body and at least a turbulent plate. The frame body has inner lead portions and outer lead portions. The turbulent plate bends downwards to form a concave portion and has a first end and a second end. The first end connects to the frame body, and the second end is higher than the inner lead portions. The chip is fixed on the lower surfaces of the inner lead portions and the turbulent plate locates at one end of the chip. The first bonding wires are electrically connected between the chip and the corresponding inner lead portions, respectively. The molding compound is used for encapsulating at least the chip, the first bonding wires, the inner lead portions, the adhesive layer and the turbulent plate. Wherein, the ratio between the thickness of the part of the molding compound residing under the outer lead portions and the thickness of the part of the molding compound residing over the outer lead portions are not equal to each other.

According to the embodiment of the present invention, the second end of the turbulent plate can be bended to be flat.

According to the embodiment of the present invention, the lead frame further includes at least a supporting bar, which is connected between the second end of the turbulent plate and the frame body. As an alternation, the supporting bar can be connected between the frame body and the turbulent plate, too.

According to the embodiment of the present invention, the inner lead portions can be designed in down-set.

According to the embodiment of the present invention, the turbulent plate can have openings.

According to the embodiment of the present invention, the lead frame can further include bus bars, which are adjacent to the inner lead portions. In addition, the chip package having asymmetric molding further includes second bonding wires electrically connected between the chip and the corresponding bus bars, respectively. The molding compound further encapsulates the second bonding wires and the bus bars.

According to the embodiment of the present invention, the ratio between the thickness of the part of the molding compound residing over the concave portion and the thickness of the part of the molding compound residing under the concave portion is larger than 1.

According to the embodiment of the present invention, the chip area takes a less than 25% ratio of the entire molding compound area.

Based on the above-described objects or others, the present invention provides a chip package having asymmetric molding, which includes a lead frame, a chip, an adhesive layer, first bonding wires and an molding compound. The lead frame includes a frame body and at least a turbulent plate. The frame body has inner lead portions, outer lead portions and a die pad. The turbulent plate bends downwards to form a concave portion and has a first end and a second end, wherein the first end connects to the frame body. The chip is fixed on the die pad and the turbulent plate locates at one end of the chip. The adhesive layer is disposed between the chip and the die pad. The first bonding wires are electrically connected between the chip and the corresponding inner lead portions, respectively. The molding compound is used for encapsulating at least the chip, the first bonding wires, the inner lead portions, the adhesive layer, the turbulent plate and the die pad. Wherein, the thickness of the part of the molding compound residing under the outer lead portions and the thickness of the part of the molding compound residing over the outer lead portions are not equal to each other.

According to the embodiment of the present invention, the second end of the turbulent plate can be bended to be flat.

According to the embodiment of the present invention, the turbulent plate is bended downwards to form a concave portion first, followed by being bended upwards; and the second end thereof is higher than the inner lead portions.

According to the embodiment of the present invention, the turbulent plate is bended downwards to form a concave portion, followed by being bended upwards; and both the second end of the turbulent plate and the inner lead portions are coplanar.

According to the embodiment of the present invention, the turbulent plate is bended downwards to form a concave portion, followed by being bended upwards; and the second end thereof is lower than the inner lead portions.

According to the embodiment of the present invention, the turbulent plate is bended downwards to form a concave portion and the second end thereof is lower than the inner lead portions.

According to the embodiment of the present invention, the lead frame further includes at least a supporting bar, which is connected between the second end of the turbulent plate and the frame body. As an alternation, the supporting bar can be connected between the frame body and the turbulent plate, too.

According to the embodiment of the present invention, the inner lead portions can be designed in down-set.

According to the embodiment of the present invention, the die pad can be lower than the inner lead portions.

According to the embodiment of the present invention, the lead frame can further include bus bars, which are adjacent to the inner lead portions. In addition, the chip package having asymmetric molding further includes second bonding wires electrically connected between the chip and the corresponding bus bars, respectively. The molding compound further encapsulates the second bonding wires and the bus bars.

According to the embodiment of the present invention, the turbulent plate can have openings.

According to the embodiment of the present invention, the thickness of the part of the molding compound residing under the hunch portion of the turbulent plate and the thickness of the part of the molding compound residing over the hunch portion of the turbulent plate are not equal to each other.

According to the embodiment of the present invention, the chip area takes a less than 25% ratio of the entire molding compound area.

Based on the above described, a turbulent plate designed in down-set is added on the lead frame in the present invention for reducing the warpage as the molding compound is condensed and shrunken, which enables the chip package of the present invention to have better reliability.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve for explaining the principles of the invention.

DESCRIPTION OF THE EMBODIMENTS

The First Embodiment

Figure 2A:
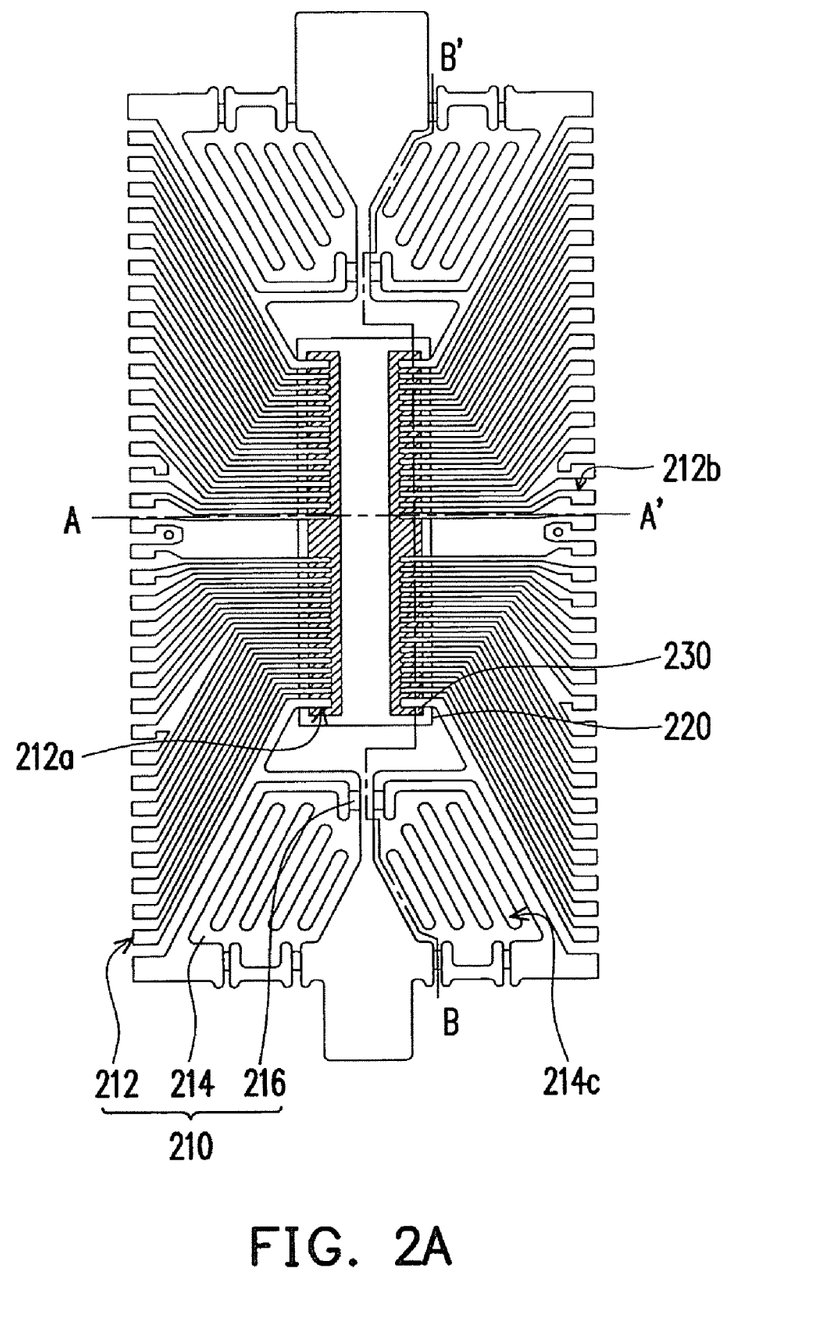
FIG. 2A is a schematic top view of a chip package without being encapsulated according to the first embodiment of the present invention, wherein the first bonding wire and the molding compound are not shown in FIG. 2A.
Figure 2B:
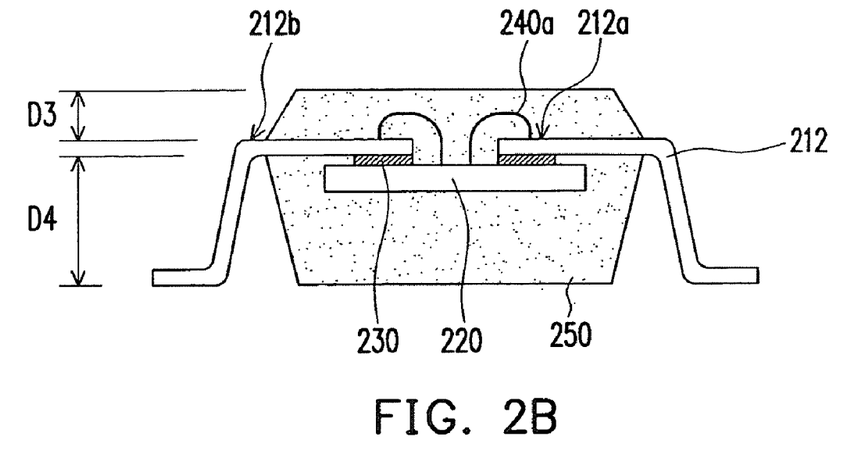
FIG. 2B is a schematic section view along A-A' of the chip package after finishing encapsulating in FIG. 2A.
Figure 2C:
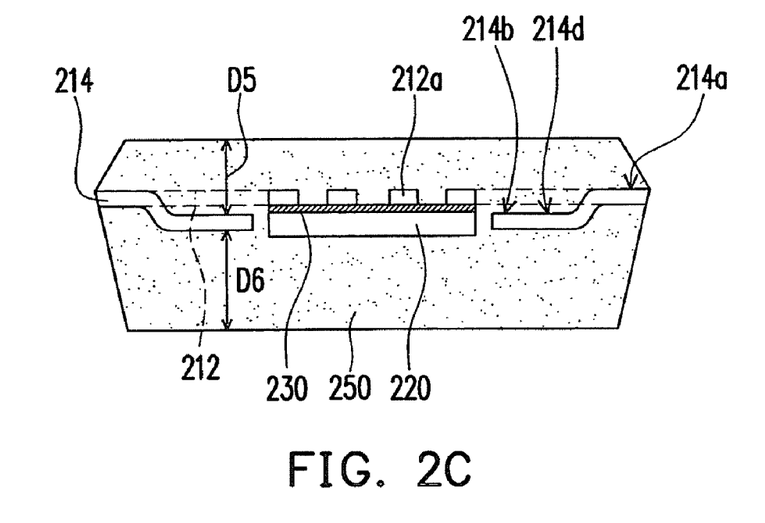
FIG. 2C is a schematic section view along B-B' of the chip package after finishing encapsulating in FIG. 2A.

FIG. 2A is a schematic top view of a chip package without being encapsulated according to the first embodiment of the present invention, wherein the first bonding wire and the molding compound are not shown. FIG. 2B is a schematic section view along A-A' of the chip package after finishing encapsulating in FIG. 2A, and FIG. 2C is a schematic section view along B-B' of the chip package after finishing encapsulating in FIG. 2A. Referring to FIGS. 2A and 2B, the chip package of the embodiment includes a lead frame 210, a chip 220, an adhesive layer 230, first bonding wires 240a and a molding compound 250; wherein, the chip 220 is fixed under the lead frame 210. The adhesive layer 230 is disposed between the chip 220 and the lead frame 210 for fixing the chip 220. The material of the adhesive layer 230 can be polyimide or nonconductive glue. The first bonding wires 240a are electrically connected between the chip 220 and the lead frame 210, and the material of the first bonding wires 240a can be gold, aluminum or other conductive materials. The molding compound 250 is used for encapsulating the partial lead frame 210, the chip 220, the adhesive layer 230 and the first bonding wires 240a, and the material of the molding compound 250 can be epoxy or other insulation materials.

Referring to FIGS. 2A and 2C, in more detail, the lead frame 210 includes a frame body 212 and at least a turbulent plate 214. The frame body 212 has inner lead portions 212a and outer lead portions 212b. The turbulent plate 214 is bended downwards to form a concave portion 214d and has a first end 214a and a second end 214b, wherein the first end 214a is connected to the frame body 212 and the second end 214b is lower than the inner lead portions 212a. In addition, the second end 214b can be bended to be flat or in other angles.

The turbulent plate 214 of the lead frame 210 is at both sides of the long-axis of the chip 220. However, the present invention does not limit the quantity and the disposition location of the turbulent plate 214. In the embodiment, the lead frame 210 can further include a supporting bar 216 connected between the second end 214b of the turbulent plate 214 and the frame body 212. In other words, both ends of the turbulent plate 214 can be connected to the frame body 212. The supporting bar 216 can be alternatively connected between the frame body 212 and the side edge of the turbulent plate 214. The second end 214b of the turbulent plate 214 may not be connected to the frame body 212. Similarly, the present invention does no limit the quantity and the disposition location of the supporting bar 216. In addition, to improve mold flow, the turbulent plate 214 can have openings 214c.

In the embodiment, there is no height difference between the inner lead portions 212a and the frame body 212, while in another embodiment the inner lead portions 212a can be designed in down-set. That is to say, the inner lead portions 212a can be disposed lower than the frame body 212. The adhesive layer 230 is disposed between the chip 220 and the inner lead portions 212a, while the first bonding wires 240a are electrically between the inner lead portions 212a and the chip 220.

Remarkably, the ratio between the thickness D5 of the part of the molding compound 250 residing over the concave portion 214d of the turbulent plate 214 and the thickness D6 of the part of the molding compound 250 residing under the concave portion 214d is larger than 1. The thickness D3 of the part of the molding compound 250 residing over the outer lead portions 212b and the thickness D4 of the part of the molding compound 250 residing under the outer lead portions 212b are not equal to each other. That is to say, the chip package of the embodiment is formed with an asymmetric molding.

The added turbulent plate 214 enables to change the stress distribution and warpage of the whole chip package as the molding compound 250 condenses and shrinks. Therefore, the present invention provides a chip package with reliability higher than the prior art. Besides, the present invention does not limit the applications in lead on chip package only. In fact, the present invention is applicable to any chip packages having a die pad configuration, which will be described thereafter. In the embodiment, from the top view, the area of the chip 220 takes a less than 25% ratio of the entire molding compound area.

The Second Embodiment

Figure 3A:
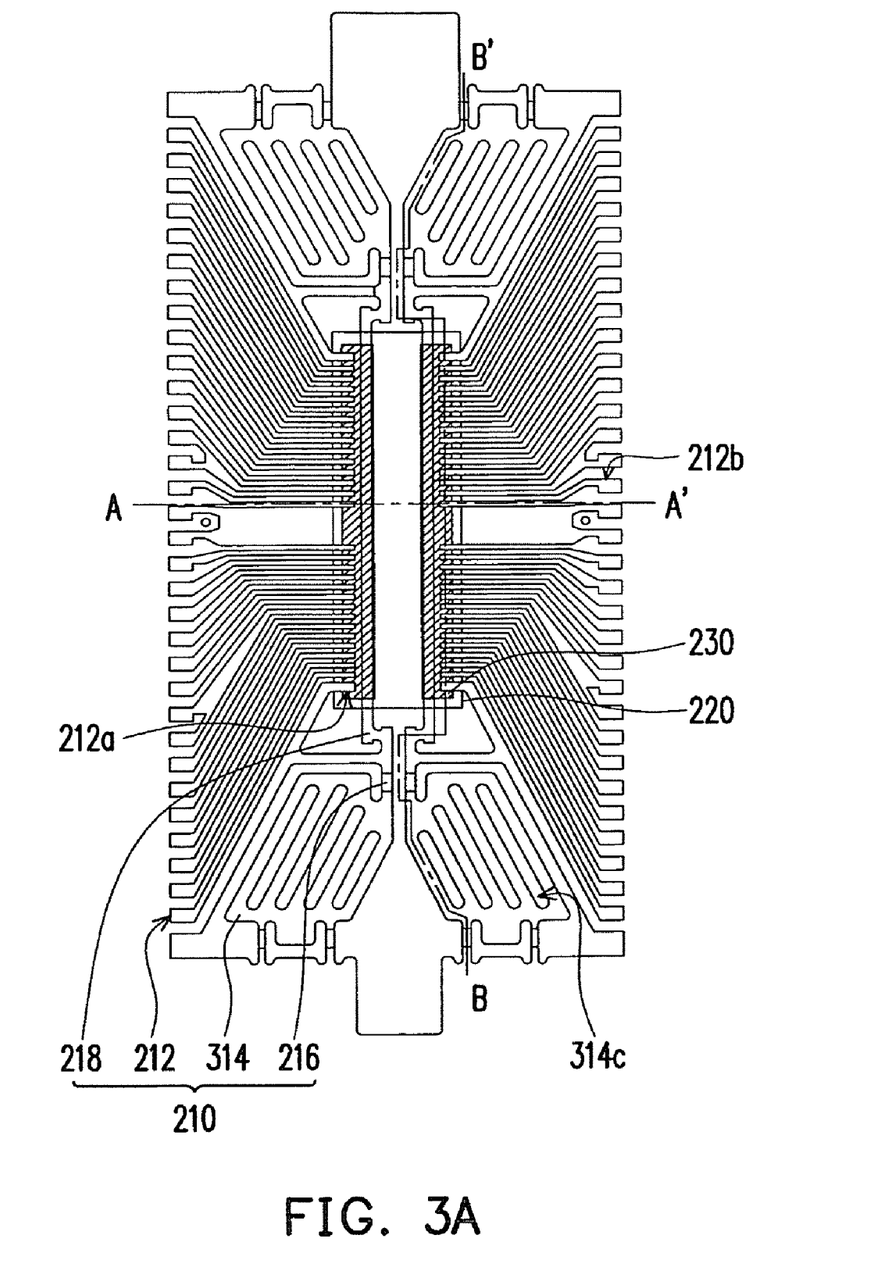
FIG. 3A is a schematic top view of a chip package without being encapsulated according to the second embodiment of the present invention, wherein the first bonding wires, the second bonding wires and the molding compound are not shown.
Figure 3B:
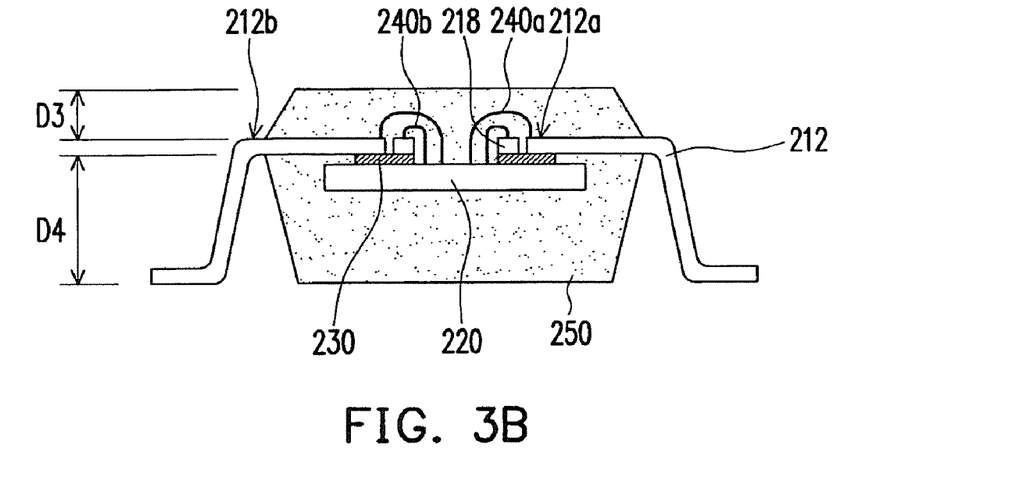
FIG. 3B is a schematic section view along A-A' of the chip package after finishing encapsulating in FIG. 3A.
Figure 3C:
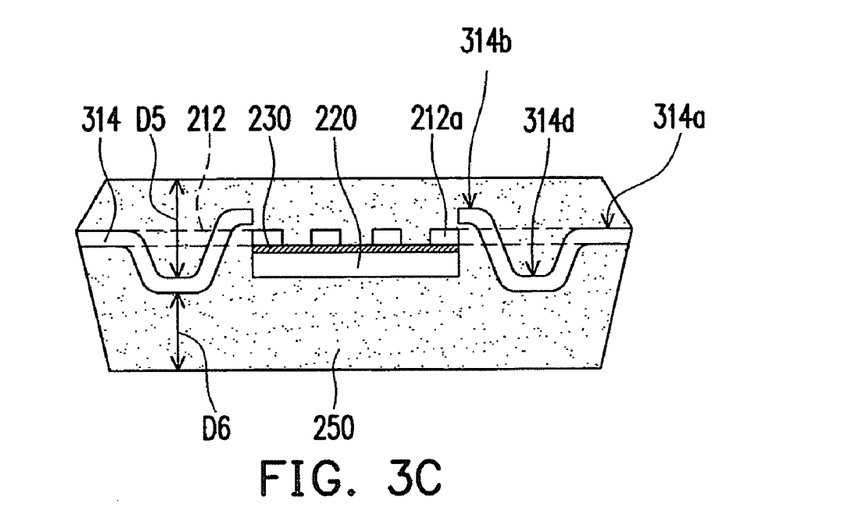
FIG. 3C is a schematic section view along B-B' of the chip package after finishing encapsulating in FIG. 3A.

FIG. 3A is a schematic top view of a chip package without being encapsulated according to the second embodiment of the present invention, wherein the first bonding wires, the second bonding wires and the molding compound are not shown. FIG. 3B is a schematic section view along A-A' of the chip package after finishing encapsulating in FIG. 3A and FIG. 3C is a schematic section view along B-B' of the chip package after finishing encapsulating in FIG. 3A. Referring to FIGS. 3A-3C, the embodiment is similar to the first embodiment. The unique point of the embodiment is that the turbulent plate 314 has a first end 314a and a second end 314b and the first end 314a is connected to the frame body 212. The turbulent plate 314 is bended downwards to form a concave portion 314d, followed by being bended upwards. The second end 314b of the turbulent plate 314 is higher than the inner lead portions 212a and can also be bended to be flat or in other angles. It is the same as the first embodiment; the second end 314b of the turbulent plate 314 can also be connected to the frame body 212 (as shown in FIG. 3A) via the supporting bar 216; or, the second end 314b of the turbulent plate 314 can be a free end. The supporting bar 216 can also be connected between the side edge of the turbulent plate 314 and the frame body 212. The turbulent plate 314 can also have openings 314c.

In the same way, the ratio between the thickness D5 of the part of the molding compound 250 residing over the concave portion 314d of the turbulent plate 314 and the thickness D6 of the part of the molding compound 250 residing under the concave portion 314d thereof is larger than 1. The thickness D4 of the part of the molding compound 250 residing under the outer lead portions 212b and the thickness D3 of the part of the molding compound 250 residing over the outer lead portions 212b are not equal to each other. That is to say, the chip package of the embodiment is formed with an asymmetric molding. Besides, from the top view, the area of the chip 220 takes a less than 25% ratio of the entire area of the molding compound 250.

Continue referring to FIGS. 3A and 3B, the frame body 210 of the embodiment further includes bus bars 218, which are adjacent to the inner lead portions 212a. The chip package having an asymmetric molding of the embodiment further includes second bonding wires 240b connected between the chip 220 and the corresponding bus bars 218, respectively. In fact, the bus bars 218 of the embodiment can be applicable to the first embodiment, too.

In another embodiment, the turbulent plate 314 also can be bended downwards to form a concave portion 314d, followed by being bended upwards; and the second end 314b thereof is lower than the inner lead portions 212a.

The Third Embodiment

Figure 4A:
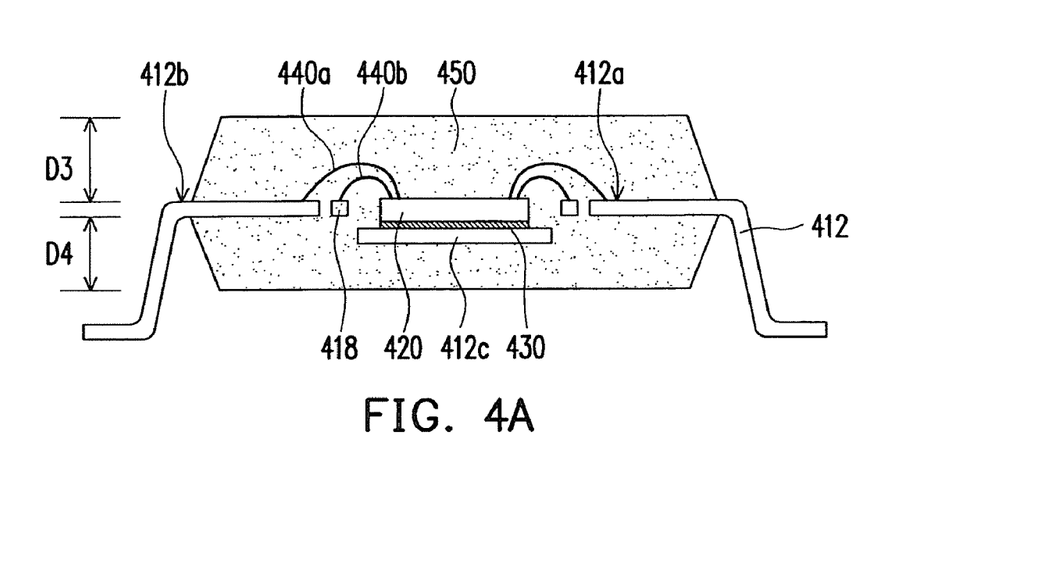
FIG. 4A-4D are schematic section views of a chip package according to the third embodiment of the present invention.
Figure 4B:
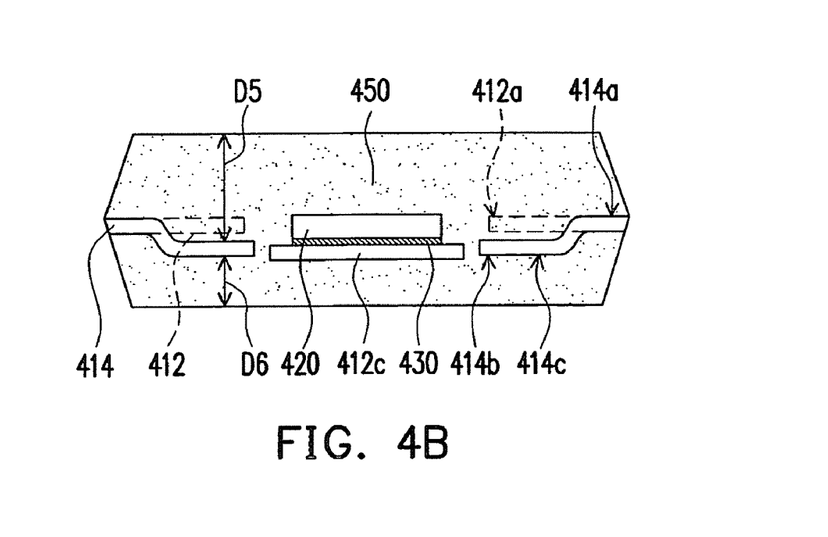

FIGS. 4A-4D are schematic section views of a chip package according to the third embodiment of the present invention. Referring to FIGS. 4A and 4B, the chip package of the embodiment includes a lead frame (not shown in the figure), a chip 420, an adhesive layer 430, first bonding wires 440a and a molding compound 450. The lead frame includes a frame body 412 and at least a turbulent plate 414, wherein the frame body 412 has inner lead portions 412a, outer lead portions 412b and a die pad 412c. The chip 420 is disposed on the die pad 412c, while the adhesive layer 430 is disposed between the chip 420 and the die pad 412c and used for fixing the chip 420. The first bonding wires 440a are electrically connected between the chip 420 and the inner lead portions 412a. The molding compound 450 encapsulates at least the chip 420, the first bonding wires 440a, the inner lead portions 412a, the adhesive layer 430, the turbulent plate 414 and the die pad 412c. The thickness D4 of the part of the molding compound 450 residing under the outer lead portions 412b and the thickness D3 of the part of the molding compound 450 residing over the outer lead portions 412b are not equal to each other. Besides, from the top view, the area of the chip 420 takes a less than 25% ratio of the entire area of the molding compound 450.

As the above-described embodiment, the turbulent plate 414 has a first end 414a and a second end 414b and the first end 414a is connected to the frame body 412. The turbulent plate 414 is bended downwards to form a concave portion 414c and the second end 414b is lower than the inner lead portions 412a. In addition, the second end 414b can be bended to be flat or in other angles. The lead frame 410 can further include a supporting bar (similar to the one shown in FIG. 2A and FIG. 3A) connected between the second end 414b of the turbulent plate 414 and the frame body 412. The supporting bar can be alternatively connected between the frame body 412 and the side edge of the turbulent plate 414. The second end 414b of the turbulent plate 414 can also not be connected to the frame body 412. In addition, the turbulent plate 414 can also have openings (similar to the ones shown in FIG. 2A and FIG. 3A). Remarkably, the ratio between the thickness D5 of the part of the molding compound 450 residing over the concave portion 414c of the turbulent plate 414 and the thickness D6 of the part of the molding compound 450 residing under the concave portion 414c thereof is larger than 1.

In the present embodiment, the lead frame further includes bus bars 418, which are adjacent to the inner lead portions 412a. The chip package having an asymmetric molding of the embodiment further includes second bonding wires 440b connected between the chip 420 and the corresponding bus bars 418, respectively. The inner lead portions 412a can be designed in down-set and the die pad 412c can also be lower than the inner lead portions 412a.

Figure 4C:
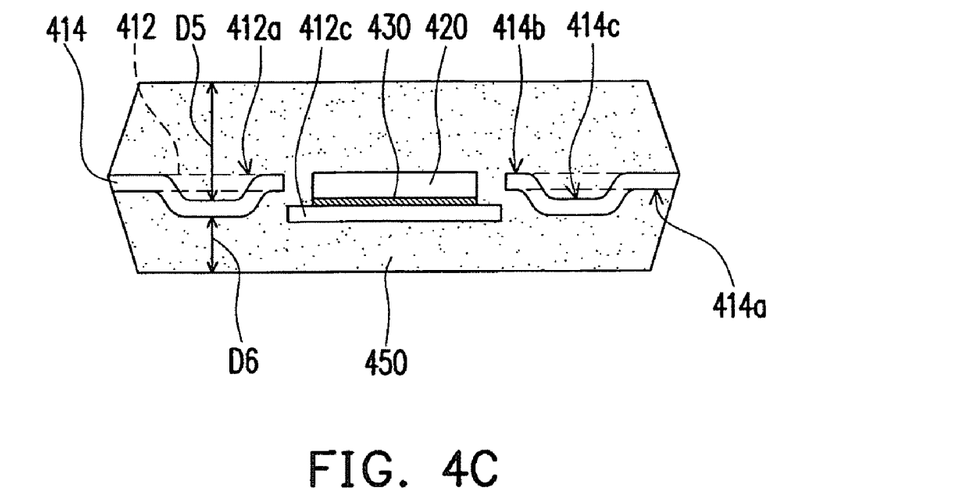

Referring to FIG. 4C, the turbulent plate 414 also can be bended downwards to form a concave portion 414c, followed by being bended upwards; and the second end 414b and the inner lead portions 412a are coplanar. However, the second end 414b can also be bended to be flat or in other angles. In another embodiment, the turbulent plate 414 can be bended downwards to form a concave portion 414c, followed by being bended upwards; and the second end 414b is lower than the inner lead portions 412a. As the above-described embodiment, the second end 414b of the turbulent plate 414 can also be connected to the frame body 412 via a supporting bar (similar to the one shown in FIG. 2A). Alternatively, the second end 414b of the turbulent plate 414 can be a free end and the supporting bar can be connected between the side edge of the turbulent plate 414 and the frame body 412. In addition, the turbulent plate 414 can have openings (similar to the one shown in FIG. 2A).

Figure 4D:
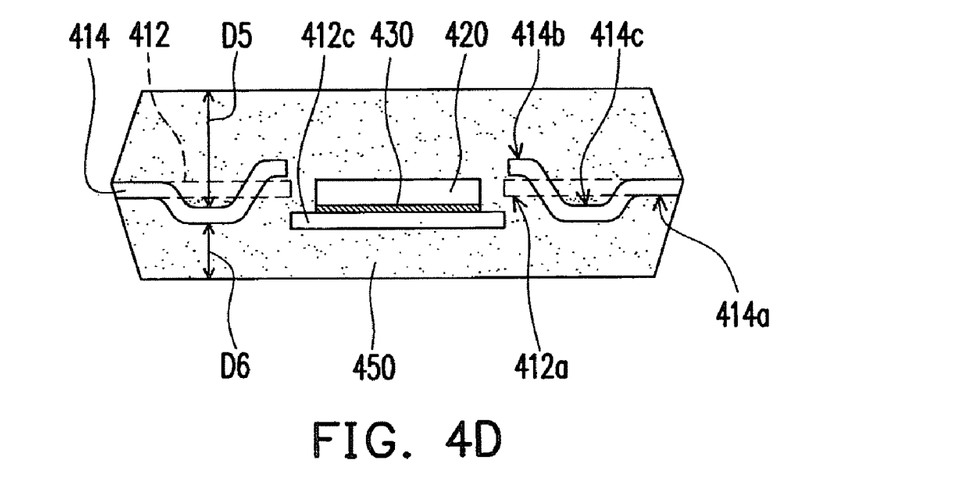

Referring to FIG. 4D, the turbulent plate 414 can also be bended downwards to form a concave portion 414c, followed by being bended upwards; and the second end 414b of the turbulent plate 414 is higher than the inner lead portions 412a. The second end 414b can also be bended to be flat or in other angles. In the same way, the second end 414b of the turbulent plate 414 can be a free end. Alternatively, the second end 414b of the turbulent plate 414 can also be connected to the frame body 412 via a supporting bar, and the supporting bar can be connected between the side edge of the turbulent plate 414 and the frame body 412.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. A chip package having asymmetric molding, comprising:
   a lead frame, comprising:
      a frame body, comprising a plurality of inner lead portions, a plurality of outer lead portions and a die pad;
      at least a turbulent plate, bended downwards to form a concave portion and having a first end and a second end, wherein the first end is connected to the frame body;
   a chip, fixed on the die pad, wherein the turbulent plate resides at an end of the chip and the concave portion of the turbulent plate is located at a side of the chip;
   an adhesive layer, disposed between the chip and the die pad;
   a plurality of first bonding wires, electrically connected between the chip and the corresponding inner lead portions, respectively; and
   a molding compound, encapsulating at least the chip, the first bonding wires, the inner lead portions, the adhesive layer, the turbulent plate and the die pad, wherein the thickness of the part of the molding compound residing under the outer lead portions and the thickness of the part of the molding compound residing over the outer lead portions are not equal to each other.

2. The chip package having asymmetric molding as recited in claim 1, wherein the second end of the turbulent plate is bended to be flat.

3. The chip package having asymmetric molding as recited in claim 1, wherein the turbulent plate is bended downwards to form the concave portion, followed by being bended upwards; and the second end of the turbulent plate is higher than the inner lead portions.

4. The chip package having asymmetric molding as recited in claim 1, wherein the turbulent plate is bended downwards to form the concave portion, followed by being bended upwards; and the second end of the turbulent plate and the inner lead portions are coplanar.

5. The chip package having asymmetric molding as recited in claim 1, wherein the turbulent plate is bended downwards to form the concave portion and the second end of the turbulent plate is lower than the inner lead portions.

6. The chip package having asymmetric molding as recited in claim 1, wherein the turbulent plate is bended downwards to form the concave portion, followed by being bended upwards.

7. The chip package having asymmetric molding as recited in claim 1, wherein the lead frame further comprises at least a supporting bar connected between the second end of the turbulent plate and the frame body.

8. The chip package having asymmetric molding as recited in claim 7, wherein the supporting bar is connected between the frame body and the side edge of the turbulent plate.

9. The chip package having asymmetric molding as recited in claim 1, wherein the inner lead portions are designed in down-set.

10. The chip package having asymmetric molding as recited in claim 1, wherein the die pad is lower than the inner lead portions.

11. The chip package having asymmetric molding as recited in claim 1, wherein the lead frame further comprises a plurality of bus bars and the bus bars are adjacent to the inner lead portions.

12. The chip package having asymmetric molding as recited in claim 11, further comprising a plurality of second bonding wires electrically connected between the chip and the corresponded bus bars, respectively, wherein the molding compound further encapsulates the second bonding wires and the bus bars.

13. The chip package having asymmetric molding as recited in claim 1, wherein the turbulent plate has a plurality of openings.

14. The chip package having asymmetric molding as recited in claim 1, wherein the thickness of the part of molding compound residing under the concave portion of the turbulent plate and the thickness of the part of the molding compound residing over the concave portion of the turbulent plate are not equal to each other.

15. The chip package having asymmetric molding as recited in claim 1, wherein the area of the chip takes a less than 25% ratio of the entire area of the molding compound.

* * * * *